United States Patent [19]
Thompson et al.

[11] Patent Number: 5,942,760
[45] Date of Patent: Aug. 24, 1999

[54] METHOD OF FORMING A SEMICONDUCTOR DEVICE UTILIZING SCALPEL MASK, AND MASK THEREFOR

[75] Inventors: Matthew Allen Thompson, Round Rock, Tex.; Pawitter Jit Singh Mangat, Chandler, Ark.

[73] Assignee: Motorola Inc., Schaumburg, Ill.

[21] Appl. No.: 08/963,325

[22] Filed: Nov. 3, 1997

[51] Int. Cl.⁶ .................................................. H01J 37/09
[52] U.S. Cl. ............................... 250/492.2; 250/492.23; 430/5; 430/296
[58] Field of Search ........................... 250/492.23, 492.2; 430/5, 296

[56] References Cited

U.S. PATENT DOCUMENTS

| | | | |
|---|---|---|---|
| 5,130,213 | 7/1992 | Berger et al. | 250/492.2 |
| 5,279,925 | 1/1994 | Berger et al. | 430/296 |
| 5,616,927 | 4/1997 | Kubota et al. | 250/492.2 |

FOREIGN PATENT DOCUMENTS

669636 A1  8/1995  European Pat. Off. ....... H01J 37/304

OTHER PUBLICATIONS

J.A.Liddle et al., "mask fabrication for projection electron–beam lithography incorporating the SCALPEL technique", J. Vac. Sci. Technol. B., vol. 9, No. 6 Nov./Dec. 1991, pp. 3001–3004.

S.D.Berger, et al, "Projection electron–beam lithography: A new approach", J.Vac.Sci. Technol. B, vol. 9, No. 6, Nov./Dec. 1991, pp. 2996–2999.

*Primary Examiner*—Jack I. Berman

[57] ABSTRACT

A mask (300) for scattering angular limited projection electron beam lithography, including a substrate (102) having an opening (103) extending into the substrate, a membrane layer (204) extending over the substrate, the membrane layer including a window portion (209) that overlies an opening in the substrate and being formed of a material having a first electron scattering power, a patterned scattering layer overlying the membrane layer, at least along the window portion of the membrane layer, the patterned scattering layer being formed of a material having a second electron scattering power that is greater than the first electron scattering power, and an encapsulating layer (210) overlying the patterned scattering layer, the encapsulating layer having a third electron scattering power that is less than the second electron scattering power.

25 Claims, 2 Drawing Sheets

METHOD OF FORMING A SEMICONDUCTOR DEVICE UTILIZING SCALPEL MASK, AND MASK THEREFOR

FIELD OF THE INVENTION

The present invention relates generally to semiconductor manufacturing, and more particularly to forming a semiconductor device utilizing a lithographic patterning mask.

BACKGROUND OF THE INVENTION

The present invention is drawn to a novel SCALPEL mask and method utilizing the SCALPEL mask and Scattering Angular Limited Projection Electron Lithography for forming semiconductor devices.

One goal in modern semiconductor fabrication is to improve the density of active elements provided on a single semiconductor die, thus increasing the number of die per wafer. As is known in the art, very large scale integration (VLSI) has evolved into ultra-high large scale integration (ULSI). In order to improve density without overly increasing die size, there is ongoing investigation in decreasing further the critical dimension (CD) of active elements provided on the semiconductor die. Lithographic techniques are typically used in the formation of multi-level circuits on a semiconductor die. Currently, lithographic techniques take advantage of I-line (365 nanometer) and deep ultra-violet (DUV, 248 nanometer) energy sources. By decreasing wavelength of the energy utilized in these lithographic techniques, smaller CD's may be realized.

Accordingly, smaller wavelength, higher energy sources have been investigated, including DUV at 193 nanometers, X-ray, Ion projection, EUV (extreme ultra-violet), as well as scattering angular limited projection electron lithography (SCALPEL). Of these techniques, SCALPEL has been identified as a particularly promising technology for achieving ever finer CD's with high throughput.

Turning to FIG. 1, the basic principles of SCALPEL are illustrated. As shown, a mask 10 having a patterned scattering layer is provided on membrane 12, through which an electron beam is projected, as represented by the arrows. The patterned scattering layer 14 has a higher scattering power than that of the membrane 12, provided by a difference in atomic numbers between the patterned scattering layer 14 and the membrane 12. Particularly, the patterned scattering layer has a higher atomic number than that of the membrane. The scattering effect of the electron beam through portions of the mask is illustrated in FIG. 1. As shown, those portions of the electron beam that pass through the patterned scattering layer 14 tend to be scattered to a greater extent as compared with those portions that pass between patterned portions (i.e., unpatterned portions) of the scattering layer 14.

As shown, the electron beam passes through the mask, is focused through an electron focusing system, represented by lens 20. The electron beam then passes through back focal plane filter 30 having an aperture that is provided to permit passage of those portions of the electron beam that were not scattered by the patterned scattering layer of the mask 10. The electron beam is then projected onto a semiconductor wafer 40 having a plurality of die 42 and a resist layer 44 formed thereon by conventional techniques such as by spinning-on. The electron beam forms a high contrast image including areas of high intensity formed by those portions of the electron beam that pass through unpatterned portions of the mask 10, and areas of relatively low intensity formed by those portions of the electron beam that pass through the patterned areas of the mask 10. In this way, a high-resolution image may be projected onto the resist layer, which is then developed to form a patterned resist layer. Thereafter, the material exposed through the patterned resist layer may be etched using an appropriate etchant. It is noted that the power of the system may be adjusted so as to provide a 3–5× reduction in image size, typically 4×.

Turning to FIGS. 2-1 to 2-4, a typical process for forming a mask for SCALPEL use is illustrated. First, a silicon substrate 102, such as on the order of 400–800 microns and 100–300 millimeters in diameter, is provided. The substrate 102 is formed of monocrystalline silicon, but other monocrystalline materials may be utilized. The substrate 102 is subjected to an LPCVD process to form silicon nitride bottom layer 100 and membrane layer 104 on opposing major surfaces of the substrate. Layers 100 and 104 are typically on the order of 1,000 angstroms of thickness. Thereafter, an etch stop layer 106 is deposited upon membrane layer 104, typically on the order of 100 angstroms in thickness. A scattering layer 108 is then provided on the etch stop layer 106. Typically, the etch stop layer is formed of Cr, while the scattering layer may be formed of any one of several high atomic number species, such as W.

Turning to FIG. 2-2, an opening 103 is etched in the substrate 102, thereby leaving window portion 109 of relatively small thickness that spans opening 103. A resist 110 is coated and patterned on scattering layer 108, as shown in FIG. 2-3, and scattering layer 108 is etched so as to form patterned scattering layer 108', as shown in FIG. 2-4. According to the final structure shown in FIG. 2-4, the electron beam may pass through the entirety of the window portion 109, and is largely blocked by the substrate 102 along un-etched portions thereof.

While SCALPEL technology has been demonstrated to provide improved resolution over conventional techniques, including I-line and DUV processing, the present inventors have recognized numerous deficiencies with conventional SCALPEL technology, particularly the mask utilized therefor.

It is recognized in the art of lithography that masks typically have to be cleaned after repeated use. However, the mask utilized in SCALPEL technology represents numerous difficulties. Particularly, the present inventors have discovered that it is relatively difficult to clean the mask, due to the topology of the mask. For example, relatively small particles may drop onto the mask and be trapped between adjacent patterned lines, that is, between patterned and unpatterned regions of the mask. In this regard, it has been found that state of the art cleaning techniques have not been sufficient to remove such particles without damaging the scattering layer on the mask. For example, the conventional aggressive RCA clean has not proven to be an effective cleaning procedure while maintaining the integrity of the mask. That is, conventional aggressive cleaning techniques utilize chemical species that undesirably interact with the materials of the mask, particularly the scattering layer thereof. In addition, because of the delicate nature of the membrane covering the openings in the substrate, physical agitation, such as ultrasonic agitation, is generally undesirable. Other cleaning techniques such as dry laser cleaning, and frozen ice cleaning are likely to be ineffective to clean adequately the mask, particularly to remove contaminants provided between patterned and unpatterned portions of the mask.

The present inventors have also recognized problems with pin hole defects in the mask, particularly in the membrane portions of the mask. Such pin hole defects result in reduced yield due to a tearing or breakage of the membrane portions at the site of the pin hole defect, due to the membrane portions being in tension.

Further, as noted above, the etch stop layer 106 is an essential component of the prior art to form an effective etch stop barrier during etching of the scattering layer. Absent such an etch stop layer, it has been found that undesirable roughening and pitting of the membrane layer 104 takes places during etching of the scattering layer, which undesirably weakens the membrane. However, it has been recognized in the art that it is desirable to decrease the overall thickness of the membrane to the extent possible. Accordingly, it is desirable to eliminate such an etch stop layer if feasible.

In consideration of the above disadvantages of the known SCALPEL mask, the present inventors have considered use of a pellicle-like structure, which are typically used in optical masks. As is known in the art, pellicles in optical systems are comprised of an optically transparent (e.g., glass) material spaced apart and above the mask. Use of the pellicle in an optical system is effective. It prevents contamination of the mask, and any fall-on defects or contamination on the pellicle are not imaged onto the resist. However, use of a pellicle in SCALPEL technology is not effective, since the pellicle increases the thickness of material through which the electron beam must pass, thereby reducing throughput, and increasing chromatic aberration. In addition, in SCALPEL technology, any contamination or fall-on defects deposited on the pellicle are nevertheless imaged onto the resist, unlike in the optical systems.

Accordingly, a need exists in the art for an improved SCALPEL technique that utilizes a mask that has improved properties, and which has membrane portions of substantially the same thickness or even reduced thickness with respect to the state of the art masks.

BRIEF DESCRIPTION OF THE DRAWINGS

FIGS. 2-1 to 2-4 illustrate conventional steps of forming a SCALPEL mask; and

FIG. 3 illustrates an embodiment of the present invention.

Figure 1:
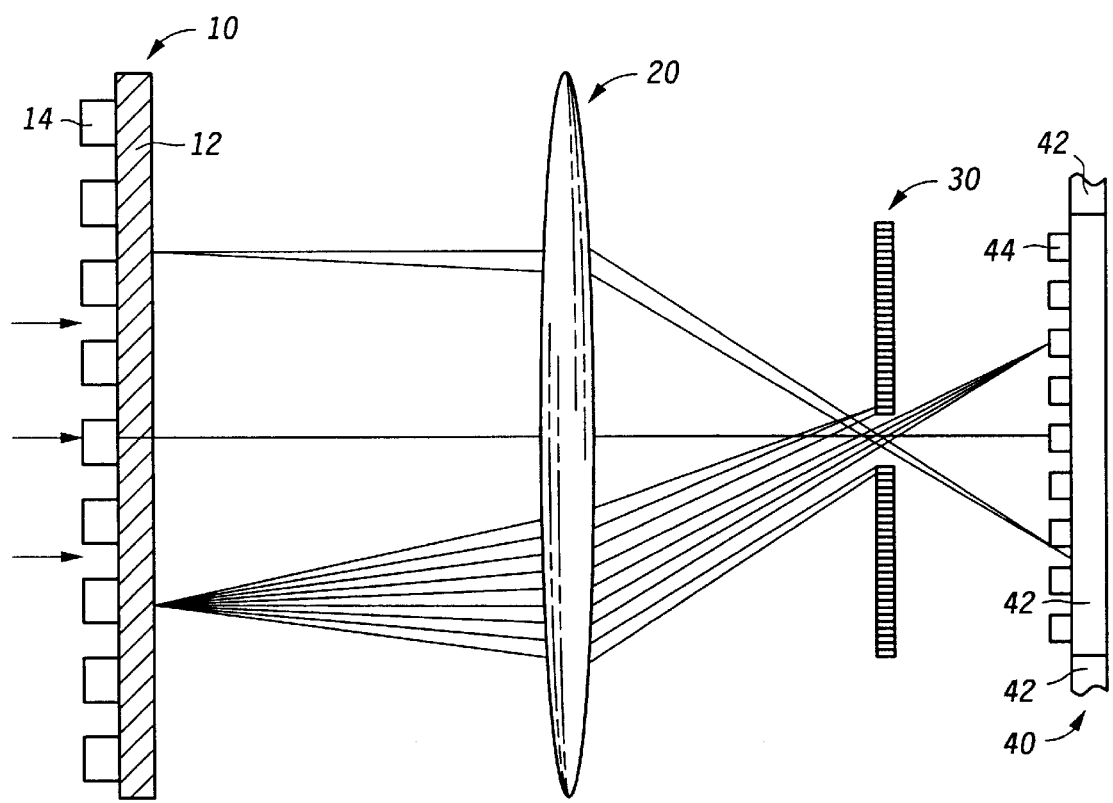
FIG. 1 illustrates the principles of scattering angular limited projection electron lithography (SCALPEL) technology.
Figure 2A:
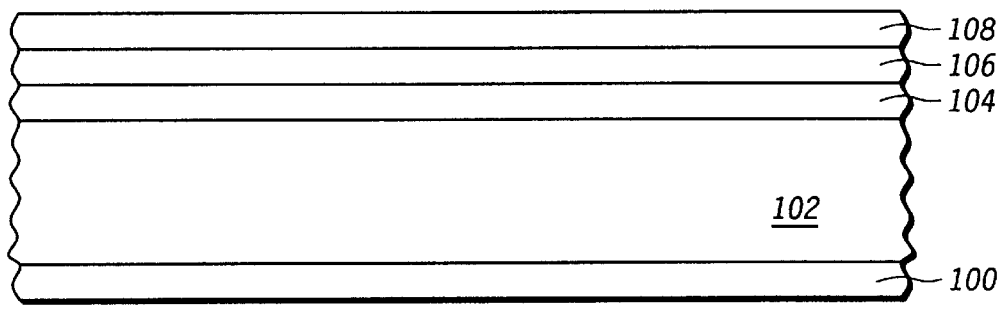
Figure 2B:
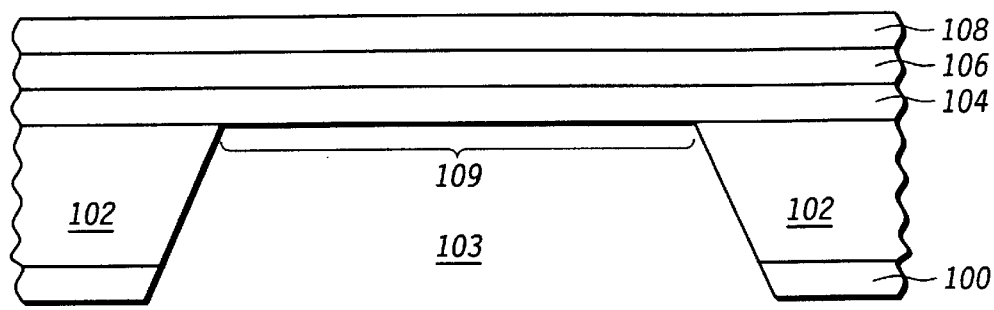
Figure 2C:
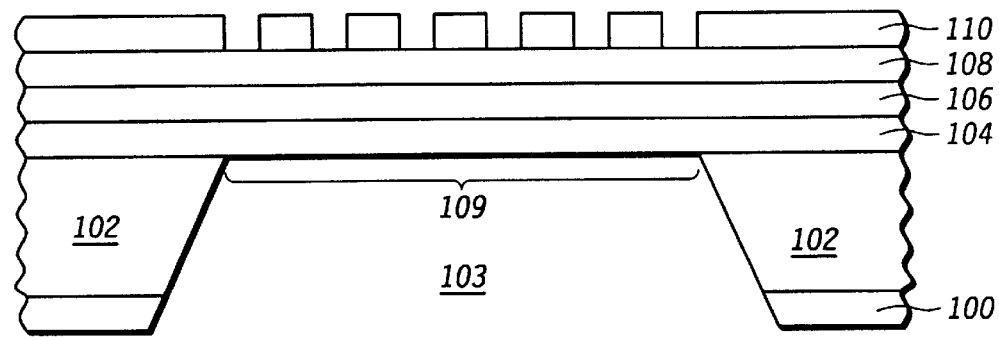
Figure 2D:
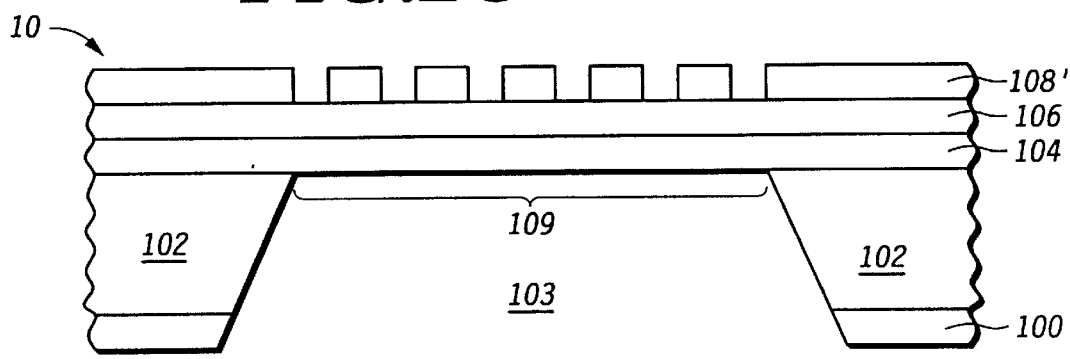

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 3:
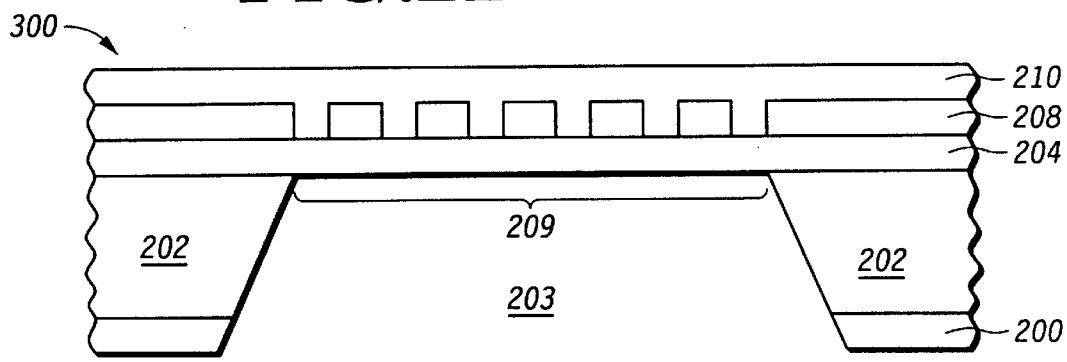

FIG. 3 shows an embodiment of the present invention, including a substrate 202, similar to the substrate 102 described above with respect to FIG. 2-1. Substrate 202 is generally formed of monocrystalline silicon, but may be formed of other monocrystalline materials that are adapted to be etched anisotropically. As described above, substrate 202 is subjected to an LPCVD process to form a bottom layer 200 formed on the secondary surface of the substrate and membrane layer 204 formed on the primary surface of the substrate. Layers 200 and 204 are preferably silicon nitride, but may be formed of other materials and other CVD techniques as desired by one of ordinary skill in the art. Unlike the conventional mask, mask 300 according to the present invention has a relatively thin membrane layer 204. Particularly, the membrane layer 204 is on the order of 300–1,000 angstroms, or 300–700 angstroms in thickness. After formation of layers 200 and 204, an opening 203 is formed to define window portion 209, and a patterned scattering layer 208 is formed as described above with respect to FIGS. 2-1 to 2-4.

Then, an encapsulating layer 210 is formed to cover the patterned scattering layer 208, as depicted in FIG. 3. The encapsulating layer 210 is preferably formed of the same material as membrane layer 204, preferably silicon nitride, and may be formed by the same CVD technique, such as LPCVD. The encapsulating layer 210, as well as the membrane layer 204, may also be formed of silicon carbide and diamond-like carbon, for example. The encapsulating layer 210 preferably has a thickness on the order of 100–700 angstroms, or 100–500 angstroms. According to the embodiment shown in FIG. 3, the combined thickness of layers 204, 208 and 210 is preferably no greater than that of the prior art. According to the present invention, membrane layer 204 may be made relatively thin since encapsulating layer 210 is subsequently formed thereon, which acts to enhance the structural integrity of the membrane layer 204.

According to the present invention, the membrane layer 204 is formed of a material that has an electron scattering power that is less than that of the scattering layer 208, due to a difference in the atomic numbers of the respective materials. The encapsulating layer 210 also has an electron scattering power that is lower than that of the scattering layer 208, and may be the same or different than that of the membrane layer 204. The scattering layer may be formed of a material from a group consisting of tungsten, titanium, tantalum, cobalt, tungsten silicide, titanium silicide, tantalum silicide, cobalt silicide, and gold.

According to the embodiment of the present invention shown in FIG. 3, the problems associated with the prior art discussed above are overcome. For example, the problems associated with cleaning the mask are largely eliminated according to the present invention. By incorporation of encapsulating layer 210 over patterned scattering layer 208, the topology of the mask is planarized, thereby enhancing the ability of the mask to be cleaned by conventional cleaning techniques. That is, contaminants or fall-on defects are prevented from being trapped between varying topological features of the mask as associated with the prior art. In addition, since the patterned scattering layer 208 is no longer exposed during cleaning, it is substantially easier to utilize an appropriate cleaning chemistry which does not chemically interact with or components of the mask 300. Thus according to the present invention, the mask may be subjected to the electron beam repeatedly, corresponding to a plurality of semiconductor die on the same or different semiconductor wafers, and then may be cleaned. It is noted that the mask may be configured to correspond to a single die, which is then stepped over the semiconductor wafer, or, may be configured for a block of semiconductor die, such as a 3×3 block.

Further, desirable dry-cleaning techniques, including dry laser cleaning and frozen ice cleaning techniques may be utilized according to the present invention, since particles are prevented from being trapped between varying topological features. In addition, with respect to all cleaning techniques, any damage to the mask is limited to the encapsulating layer, rather than the patterned scattering layer, unlike the prior art. Accordingly, it is quite clear that the present invention provides a SCALPEL mask that is more robust, particularly more resistive cleaning techniques. Accordingly, the usable life of the mask is enhanced.

The present invention also effectively reduces pin hole defects in SCALPEL masks. More particularly, should a pin hole defect appear in membrane layer 204 during formation, such a defect is substantially filled or plugged by deposition of encapsulating layer 210 thereon. In contrast, according to the prior art, should a pin hole defect appear within membrane layer 104, it propagates and extends through the thickness of the membrane layer 204 during formation. Accordingly, the present invention provides an even more robust mask in terms of defectivity over the prior art.

As shown in FIG. 3, this particular embodiment of the present invention does not include an etch stop layer, such as etch stop layer 106 according to the prior art, which is formed of Cr. Elimination of this etch stop layer is made possible by provision of an encapsulating layer 210. Particularly, membrane layer 204 itself acts as an etch stop during patterning and etching of the scattering layer to form patterned scattering layer 208. Even though the etchant material may partially etch into layer 204 and cause a roughening thereof, the encapsulant layer 210 according to the present invention is effective to fill in such roughened areas and maintain the structural integrity of the membrane as a whole.

Accordingly, the present invention provides an improved SCALPEL mask that has membrane portions of substantially the same or even lesser thickness than the prior art, while overcoming the disadvantages described in detail above. It is understood that the present invention is not particularly limited to the embodiments shown herein, and that modifications and variations may be made thereto by one of ordinary skill in the art without departing from the spirit and scope of the appended claims.

What is claimed is:

1. A mask for scattering angular limited projection electron beam lithography, comprising:

a substrate having a primary surface and a secondary surface opposite the primary surface, and an opening extending into the substrate through the secondary surface;

a membrane layer extending over the primary surface, the membrane layer including a window portion that overlies the opening in the substrate and being comprised of a material having a first electron scattering power;

a patterned scattering layer overlying the membrane layer, at least along the window portion of the membrane layer, the patterned scattering layer being comprised of a material having a second electron scattering power that is greater than the first electron scattering power; and an encapsulating layer overlying the patterned scattering layer, the encapsulating layer having a third electron scattering power that is less than the second electron scattering power.

2. The mask of claim 1, wherein the substrate comprises a monocrystalline material.

3. The mask of claim 2, wherein monocrystalline material is silicon.

4. The mask of claim 1, wherein the membrane layer and the encapsulating layer are comprised of a same material.

5. The mask of claim 4, wherein said same material is selected from the group consisting of silicon nitride, silicon carbide, and diamond-like carbon.

6. The mask of claim 5, wherein said same material is silicon nitride.

7. The mask of claim 1, wherein the patterned scattering layer comprises a material from a group consisting of tungsten, titanium, tantalum, cobalt, tungsten silicide, titanium silicide, tantalum silicide, cobalt silicide, and gold.

8. The mask of claim 1, wherein the membrane layer has a thickness of approximately 300 to 1000 angstroms.

9. The mask of claim 8, wherein the membrane layer has a thickness of approximately 300 to 700 angstroms.

10. The mask of claim 1, wherein the encapsulating layer has a thickness of approximately 100 to 700 angstroms.

11. The mask of claim 10, wherein the encapsulating layer has a thickness of approximately 100 to 500 angstroms.

12. A method of patterning a resist on a semiconductor device by scattering angular limited projection lithography, comprising the steps:

forming a resist on a semiconductor device; and projecting an electron beam through a mask and onto the resist formed on the semiconductor device, the electron beam forming a contrast image on the resist, the contrast image including areas of low intensity and areas of high intensity, wherein the mask comprises: (i) a substrate having a primary surface and a secondary surface opposite the primary surface, and an opening extending into the substrate through the secondary surface, (ii) a membrane layer extending over the primary surface, the membrane layer including a window portion that overlies the opening in the substrate and being comprised of a material having a first electron scattering power, (iii) a patterned scattering layer overlying the membrane layer, at least along the window portion of the membrane layer, the patterned scattering layer being comprised of a material having a second electron scattering power that is greater than the first electron scattering power; and (iv) an encapsulating layer overlying the patterned scattering layer, the encapsulating layer having a third electron scattering power that is less than the second electron scattering power, and the areas of low intensity correspond to the patterned scattering layer.

13. The method of claim 12, wherein the substrate comprises a monocrystalline material.

14. The method of claim 13, wherein monocrystalline material is silicon.

15. The method of claim 12, wherein the membrane layer and the encapsulating layer are comprised of a same material.

16. The method of claim 15, wherein said same material is selected from the group consisting of silicon nitride, silicon carbide, and diamond-like carbon.

17. The method of claim 16, wherein said same material is silicon nitride.

18. The method of claim 12, wherein the patterned scattering layer comprises a material from a group consisting of tungsten, titanium, tantalum, cobalt, tungsten silicide, titanium silicide, tantalum silicide, cobalt silicide, and gold.

19. The method of claim 12, wherein the membrane layer has a thickness of approximately 300 to 1000 angstroms.

20. The method of claim 19, wherein the membrane layer has a thickness of approximately 300 to 700 angstroms.

21. The method of claim 12, wherein the encapsulating layer has a thickness of approximately 100 to 700 angstroms.

22. The method of claim 21, wherein the encapsulating layer has a thickness of approximately 100 to 500 angstroms.

23. The method of claim 12, wherein the step of projecting is repeated a plurality of times, and the method further comprises the step of cleaning the mask after the projecting step is repeated said plurality of times.

24. The method of claim 23, wherein the step of cleaning is carried out by at least one technique selected from the group consisting of dry laser cleaning, frozen ice cleaning, and chemical cleaning.

25. A method of forming a semiconductor device, comprising the steps:

forming a resist on a semiconductor wafer having a plurality of semiconductor die;

projecting an electron beam through a mask and onto the resist formed on the plurality of semiconductor die, the electron beam forming a contrast image on the resist, the contrast image including areas of low intensity and areas of high intensity, wherein the mask comprises: (i) a substrate having a primary surface and a secondary surface opposite the primary surface, and an opening extending into the substrate through the secondary surface, (ii) a membrane layer extending over the primary surface, the membrane layer including a window portion that overlies the opening in the substrate and being comprised of a material having a first electron scattering power, (iii) a patterned scattering layer overlying the membrane layer, at least along the window portion of the membrane layer, the patterned scattering layer being comprised of a material having a second electron scattering power that is greater than the first electron scattering power, and (iv) an encapsulating layer overlying the patterned scattering layer, the encapsulating layer having a third electron scattering power that is less than the second electron scattering power, and the areas of low intensity correspond to the patterned scattering layer; and developing the resist.

* * * * *